(12) United States Patent
Yamagami

(10) Patent No.: US 11,315,624 B2
(45) Date of Patent: Apr. 26, 2022

(54) SEMICONDUCTOR MEMORY DEVICE

(71) Applicant: SOCIONEXT INC., Kanagawa (JP)

(72) Inventor: Yoshinobu Yamagami, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/211,552

(22) Filed: Mar. 24, 2021

(65) Prior Publication Data

US 2021/0241817 A1 Aug. 5, 2021

Related U.S. Application Data

(63) Continuation of application No. PCT/JP2018/037038, filed on Oct. 3, 2018.

(51) Int. Cl.
| | |
|---|---|
| *G11C 11/00* | (2006.01) |
| *G11C 11/408* | (2006.01) |
| *G11C 5/06* | (2006.01) |
| *G11C 11/4094* | (2006.01) |

(52) U.S. Cl.
CPC ............ *G11C 11/4085* (2013.01); *G11C 5/06* (2013.01); *G11C 11/4087* (2013.01); *G11C 11/4094* (2013.01)

(58) Field of Classification Search
CPC .... G11C 11/4085; G11C 5/06; G11C 11/4087
USPC .................................. 365/185.13, 154, 156
See application file for complete search history.

(56) References Cited

U.S. PATENT DOCUMENTS

| | | |
|---|---|---|
| 2004/0218455 A1 | 11/2004 | Nii |
| 2005/0201185 A1 | 9/2005 | Nii |
| 2006/0092680 A1 | 5/2006 | Nii |
| 2009/0067220 A1* | 3/2009 | Asayama .............. G11C 11/412 365/154 |
| 2011/0026289 A1 | 2/2011 | Liaw |
| 2011/0026308 A1 | 2/2011 | Liaw |

FOREIGN PATENT DOCUMENTS

| | | |
|---|---|---|
| JP | S63-140483 A | 6/1988 |
| JP | H5-152542 A | 6/1993 |
| JP | 2004-335535 A | 11/2004 |
| JP | 2009-076931 A | 4/2009 |
| JP | 2011-35398 A | 2/2011 |

OTHER PUBLICATIONS

International Search Report issued in corresponding International Patent Application No. PCT/JP2018/037038, dated Dec. 25, 2018, with partial translation.

* cited by examiner

*Primary Examiner* — Huan Hoang
(74) *Attorney, Agent, or Firm* — McDermott Will & Emery LLP

(57) ABSTRACT

A memory cell of a 2-port static random access memory (SRAM) includes first and second p-type transistors and first to sixth n-type transistors. Gate interconnects extend in the X direction and are arranged in three rows in the Y direction. The gate interconnects in the first row form gates of the first n-type transistor, the first p-type transistor, and the fourth n-type transistor, the gate interconnect in the second row forms gates of the fifth and sixth n-type transistors, and the gate interconnects in the third row form gates of the third n-type transistor, the second n-type transistor, and the second p-type transistor.

3 Claims, 9 Drawing Sheets

SEMICONDUCTOR MEMORY DEVICE

CROSS-REFERENCE TO RELATED APPLICATIONS

This is a continuation of International Application No. PCT/JP2018/037038 filed on Oct. 3, 2018. The entire disclosure of this application is incorporated by reference herein.

BACKGROUND

The present disclosure relates to a semiconductor memory device, and more particularly to a layout structure of memory cells of a 2-port static random access memory (SRAM).

Japanese Unexamined Patent Publication No. S63-140483 (Patent Document 1) proposes a 2-port SRAM capable of read/write of data from/into a memory cell array in two directions perpendicular to each other. In the circuit configuration of memory cells described in this patent, first word lines and second bit line pairs extend in the first direction, and second word lines and first bit line pairs extend in the second direction perpendicular to the first direction.

Japanese Unexamined Patent Publication No. 2009-76931 (Patent Document 2) proposes a layout structure of memory cells of a 2-port SRAM.

SUMMARY

Patent Document 1 however does not disclose a specific layout structure of memory cells of the 2-port SRAM.

The layout structure disclosed in Patent Document 2 is based on the premise that read/write of data is performed, not in two directions perpendicular to each other, but in the same direction. That is, first and second word lines extend in the first direction, and first and second bit line pairs extend in the second direction perpendicular to the first direction. Therefore, it is not easy to apply this layout structure to the circuit configuration of memory cells described in Patent Document 1. For example, it is necessary to separate adjacent memory cells from each other, or change the wiring directions. To do this, there arises a problem of increasing the area of the memory cell array.

An objective of the present disclosure is providing a layout structure of memory cells of a 2-port SRAM suitable for read/write of data in two directions perpendicular to each other.

In one mode of the present disclosure, a semiconductor memory device includes: a memory cell; a first word line extending in a first direction; a first bit line pair constituted by a first main bit line and a first sub-bit line extending in a second direction perpendicular to the first direction; a second word line extending in the second direction; and a second bit line pair constituted by a second main bit line and a second sub-bit line extending in the first direction, wherein the memory cell includes a first inverter including a first p-type transistor and a first n-type transistor connected in series, an input of the first inverter being connected with a first node and an output connected with a second node, a second inverter including a second p-type transistor and a second n-type transistor connected in series, an input of the second inverter being connected with the second node and an output connected with the first node, a third n-type transistor connected between the first main bit line and the first node, having a gate connected with the first word line, a fourth n-type transistor connected between the first sub-bit line and the second node, having a gate connected with the first word line, a fifth n-type transistor connected between the second main bit line and the first node, having a gate connected with the second word line, and a sixth n-type transistor connected between the second sub-bit line and the second node, having a gate connected with the second word line, gate interconnects that are to be gates of the first and second p-type transistors and the first to sixth n-type transistors extend in the first direction and are arranged in three rows in the second direction, the gate interconnect in the first row forms the gates of the first n-type transistor, the first p-type transistor, and the fourth n-type transistor, the gate interconnect in the second row forms the gates of the fifth and sixth n-type transistors, and the gate interconnect in the third row forms the gates of the third n-type transistor, the second n-type transistor, and the second p-type transistor.

According to the above mode, in the memory cell, gate interconnects that are to be the gates of the first and second p-type transistors and the first to sixth n-type transistors extend in the first direction and are arranged in three rows in the second direction perpendicular to the first direction. With this arrangement, the size of the memory cell in the second direction can be sufficiently secured for the first word line and the second bit line pair extending in the first direction.

In another mode of the present disclosure, a semiconductor memory device includes: a memory cell; a first word line extending in a first direction; a first bit line pair constituted by a first main bit line and a first sub-bit line extending in a second direction perpendicular to the first direction; a second word line; and a second bit line pair constituted by a second main bit line and a second sub-bit line, wherein the memory cell includes a first inverter including a first p-type transistor and a first n-type transistor connected in series, an input of the first inverter being connected with a first node and an output connected with a second node, a second inverter including a second p-type transistor and a second n-type transistor connected in series, an input of the second inverter being connected with the second node and an output connected with the first node, a third n-type transistor connected between the first main bit line and the first node, having a gate connected with the first word line, a fourth n-type transistor connected between the first sub-bit line and the second node, having a gate connected with the first word line, a fifth n-type transistor connected between the second main bit line and the first node, having a gate connected with the second word line, and a sixth n-type transistor connected between the second sub-bit line and the second node, having a gate connected with the second word line, gate interconnects that are to be gates of the first and second p-type transistors and the first to sixth n-type transistors extend in the first direction and are arranged in three rows in the second direction, the gate interconnect in the first row forms the gates of the first n-type transistor, the first p-type transistor, and the fourth n-type transistor, the gate interconnect in the second row forms the gates of the fifth and sixth n-type transistors, the gate interconnect in the third row forms the gates of the third n-type transistor, the second n-type transistor, and the second p-type transistor, and the memory cell is connected with the first word line through a via formed at an end of the memory cell in the first direction, and is connected with the first main bit line and the first sub-bit line through vias formed at ends of the memory cell in the second direction.

According to the above mode, in the memory cell, gate interconnects that are to be the gates of the first and second p-type transistors and the first to sixth n-type transistors extend in the first direction and are arranged in three rows in the second direction perpendicular to the first direction. With this arrangement, the size of the memory cell in the second direction can be sufficiently secured for interconnects such as the first word line extending in the first direction.

Also, the memory cell is connected with the first word line through a via formed at an end of the memory cell in the first direction. With this connection, two memory cells adjacent in the first direction are connectable with the first word line through a common via. Also, the memory cell is connected with the first main bit line and the first sub-bit line through vias formed at the ends of the memory cell in the second direction. With this connection, two memory cells adjacent in the second direction are connectable with the first main bit line or the first sub-bit line through a common via. Thus, the area of the memory cell array can be reduced.

In yet another mode of the present disclosure, a semiconductor memory device includes: a memory cell; a first word line; a first bit line pair constituted by a first main bit line and a first sub-bit line; a second word line; and a second bit line pair constituted by a second main bit line and a second sub-bit line, wherein the memory cell includes a first inverter including a first p-type transistor and a first n-type transistor connected in series, an input of the first inverter being connected with a first node and an output connected with a second node, a second inverter including a second p-type transistor and a second n-type transistor connected in series, an input of the second inverter being connected with the second node and an output connected with the first node, a third n-type transistor connected between the first main bit line and the first node, having a gate connected with the first word line, a fourth n-type transistor connected between the first sub-bit line and the second node, having a gate connected with the first word line, a fifth n-type transistor connected between the second main bit line and the first node, having a gate connected with the second word line, and a sixth n-type transistor connected between the second sub-bit line and the second node, having a gate connected with the second word line, gate interconnects that are to be gates of the first and second p-type transistors and the first to sixth n-type transistors extend in a first direction and are arranged in three rows in a second direction perpendicular to the first direction, the gate interconnect in the first row forms the gates of the first n-type transistor, the first p-type transistor, and the fourth n-type transistor, the gate interconnect in the second row forms the gates of the fifth and sixth n-type transistors, the gate interconnect in the third row forms the gates of the third n-type transistor, the second n-type transistor, and the second p-type transistor, the fourth n-type transistor is located on a first-hand side in the first direction with respect to the first n-type transistor and the first p-type transistor, and the third n-type transistor is located on a second-hand side in the first direction with respect to the second n-type transistor and the second p-type transistor, the second-hand side being the side opposite to the first-hand side.

According to the above mode, in the memory cell, gate interconnects that are to be the gates of the first and second p-type transistors and the first to sixth n-type transistors extend in the first direction and are arranged in three rows in the second direction perpendicular to the first direction. With this arrangement, the size of the memory cell in the second direction can be sufficiently secured for interconnects extending in the first direction.

Also, the fourth n-type transistor is located on a first-hand side in the first direction with respect to the first n-type transistor and the first p-type transistor constituting the first inverter, and the third n-type transistor is located on a second-hand side in the first direction with respect to the second n-type transistor and the second p-type transistor constituting the second inverter, the second-hand side being the side opposite to the first-hand side. In this way, by placing the third n-type transistor and the fourth n-type transistor point-symmetrically with respect to the center of the memory cell, the area of the memory cell can be made smaller.

According to the semiconductor memory device of the present disclosure, provided is a layout structure of memory cells of a 2-port SRAM suitable for read/write of data in two directions perpendicular to each other.

DETAILED DESCRIPTION

An embodiment of the present disclosure will be described hereinafter with reference to the accompanying drawings. Note that, in the following description, the p-conductivity type is simply called the p-type and the n-conductivity type is simply called the n-type. Note also that the power supply voltage VDD is simply called VDD and the grounding voltage VSS is simply called VSS.

Embodiment

Figure 1:
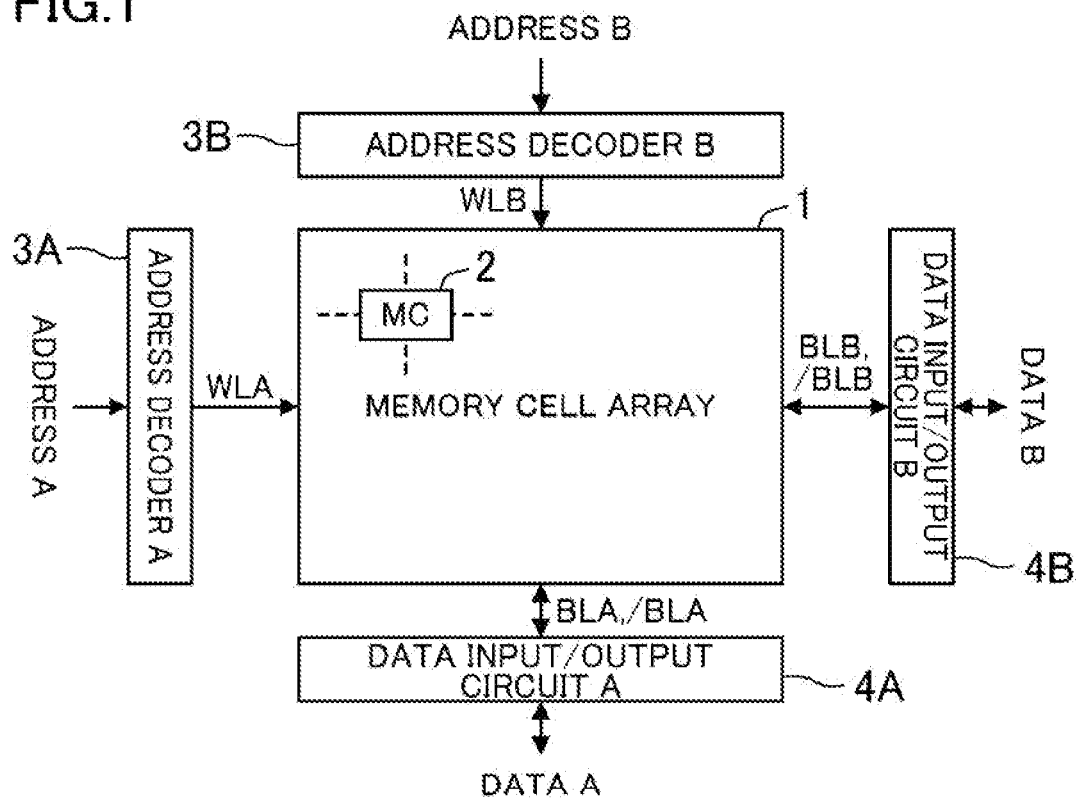
FIG. 1 is a view showing an example of the entire configuration of a circuit block of a semiconductor memory device according to an embodiment.

FIG. 1 is a view showing an example of the entire configuration of a circuit block of a semiconductor memory device according to this embodiment. In FIG. 1, the semiconductor memory device, which is a 2-port static random access memory (SRAM), includes a memory cell array 1, address decoders 3A and 3B, and data input/output circuits 4A and 4B. Illustration of the other circuits is omitted here. The memory cell array 1 includes a plurality of memory cells 2 (shown as MC in FIG. 1) arranged in an array.

The semiconductor memory device of FIG. 1 has an address A input terminal and a data A input/output terminal that correspond to port A, and an address B input terminal and a data B input/output terminal that correspond to port B. The address decoder 3A and the data input/output circuit 4A correspond to the port A, and the address decoder 3B and the data input/output circuit 4B correspond to the port B.

The address decoder 3A decodes address A input thereinto and activates a first word line WLA corresponding to the address A. The address decoder 3B decodes address B input thereinto and activates a second word line WLB corresponding to the address B. The data input/output circuit 4A is connected with a first bit line pair BLA, /BLA and exchanges data with the memory cell array 1 and with the data A input/output terminal. The data input/output circuit 4B is connected with a second bit line pair BLB, /BLB and exchanges data with the memory cell array 1 and with the data B input/output terminal.

Figure 2:
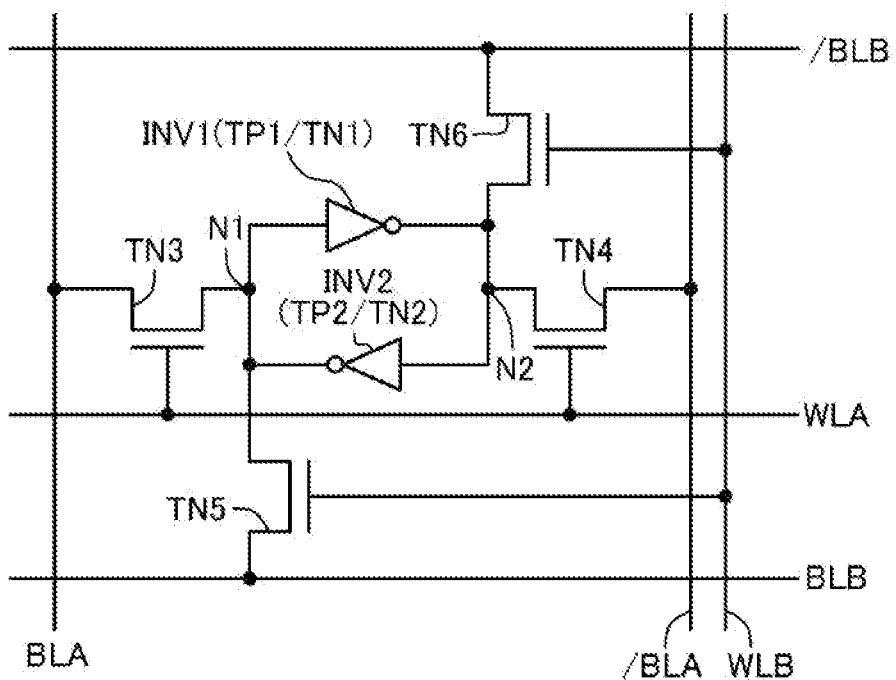
FIG. 2 is a circuit diagram of a 2-port SRAM cell.

FIG. 2 is a circuit diagram of the memory cell 2. As shown in FIG. 2, the memory cell 2 includes a first inverter INV1, a second inverter INV2, and n-type transistors TN3 to TN6. The first inverter INV1 includes a p-type transistor TP1 and an n-type transistor TN1 connected in series, of which the input is connected with a first node N1 and the output is connected with a second node N2. The second inverter INV2 includes a p-type transistor TP2 and an n-type transistor TN2 connected in series, of which the input is connected with the second node N2 and the output is connected with the first node N1.

The transistor TN3 is connected between the first main bit line BLA constituting the first bit line pair BLA, /BLA and the first node N1, with its gate connected with the first word line WLA. The transistor TN4 is connected between the first sub-bit line /BLA constituting the first bit line pair BLA, /BLA and the second node N2, with its gate connected with the first word line WLA. The transistor TN5 is connected between the second main bit line BLB constituting the second bit line pair BLB, /BLB and the first node N1, with its gate connected with the second word line WLB. The transistor TN6 is connected between the second sub-bit line /BLB constituting the second bit line pair BLB, /BLB and the second node N2, with its gate connected with the second word line WLB.

Figure 3:
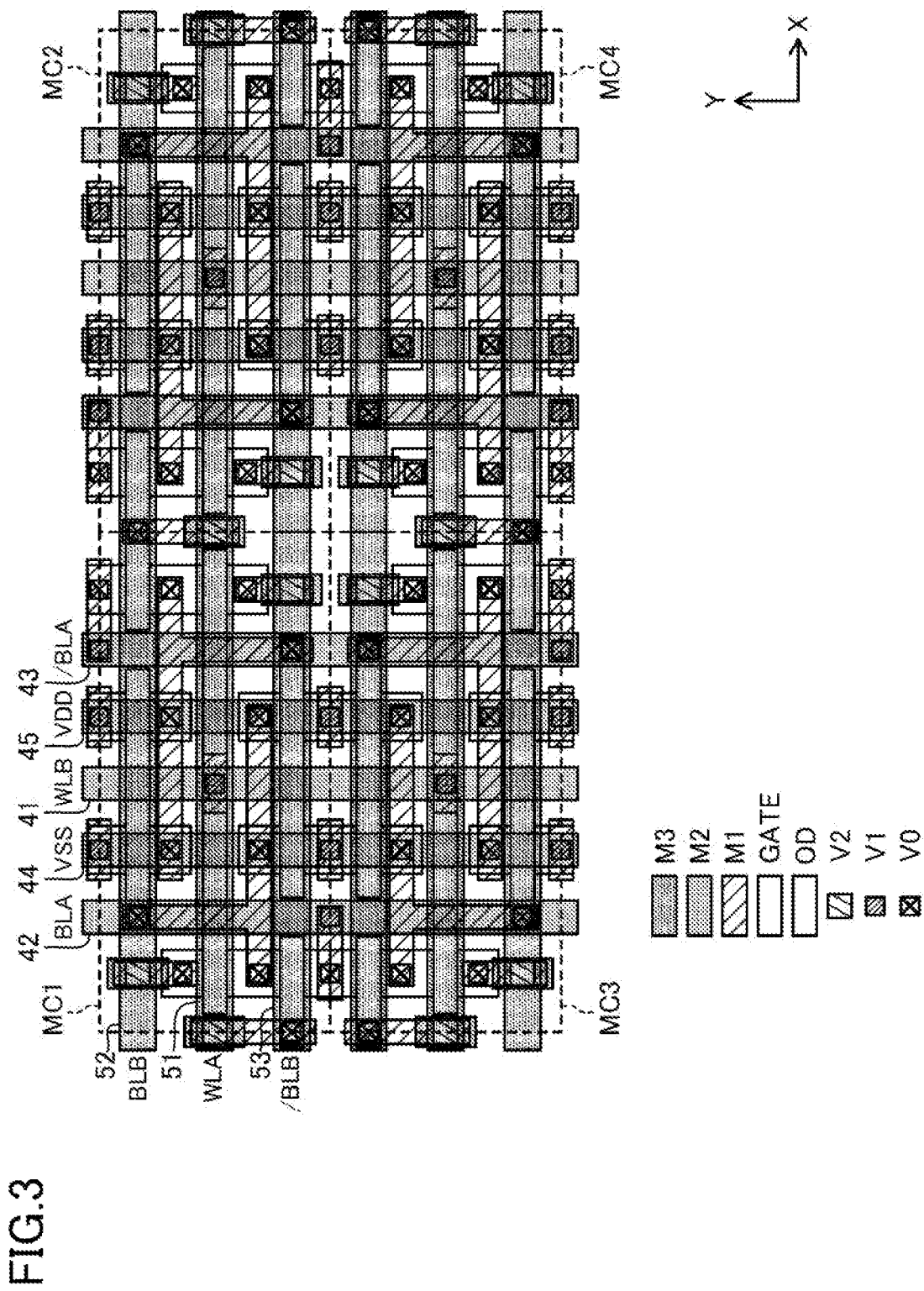
FIG. 3 is a plan view showing an example of the layout structure of SRAM cells according to the embodiment.
Figure 4:
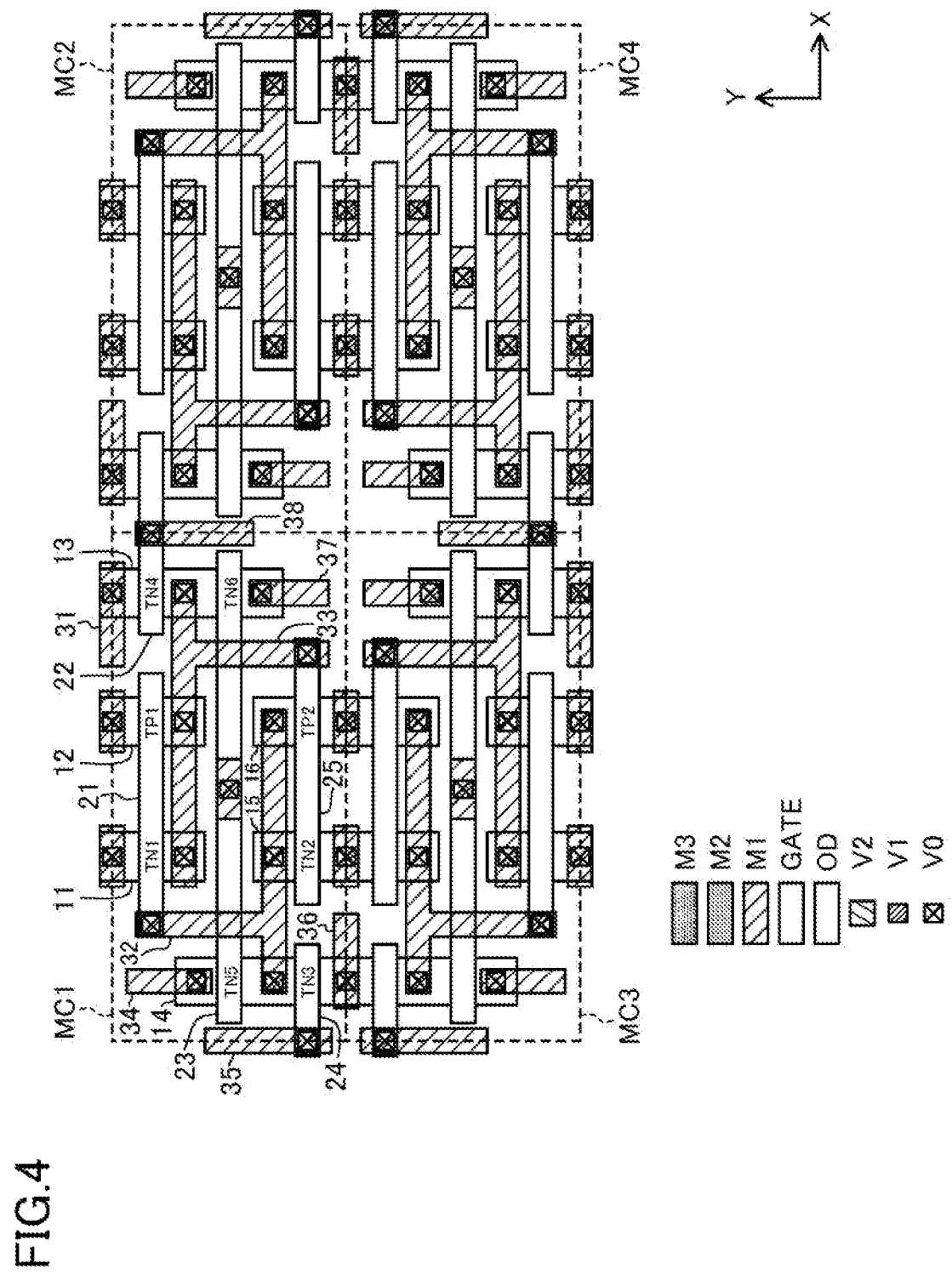
FIG. 4 is a layer-by-layer plan view showing the layout structure of FIG. 3.
Figure 5:
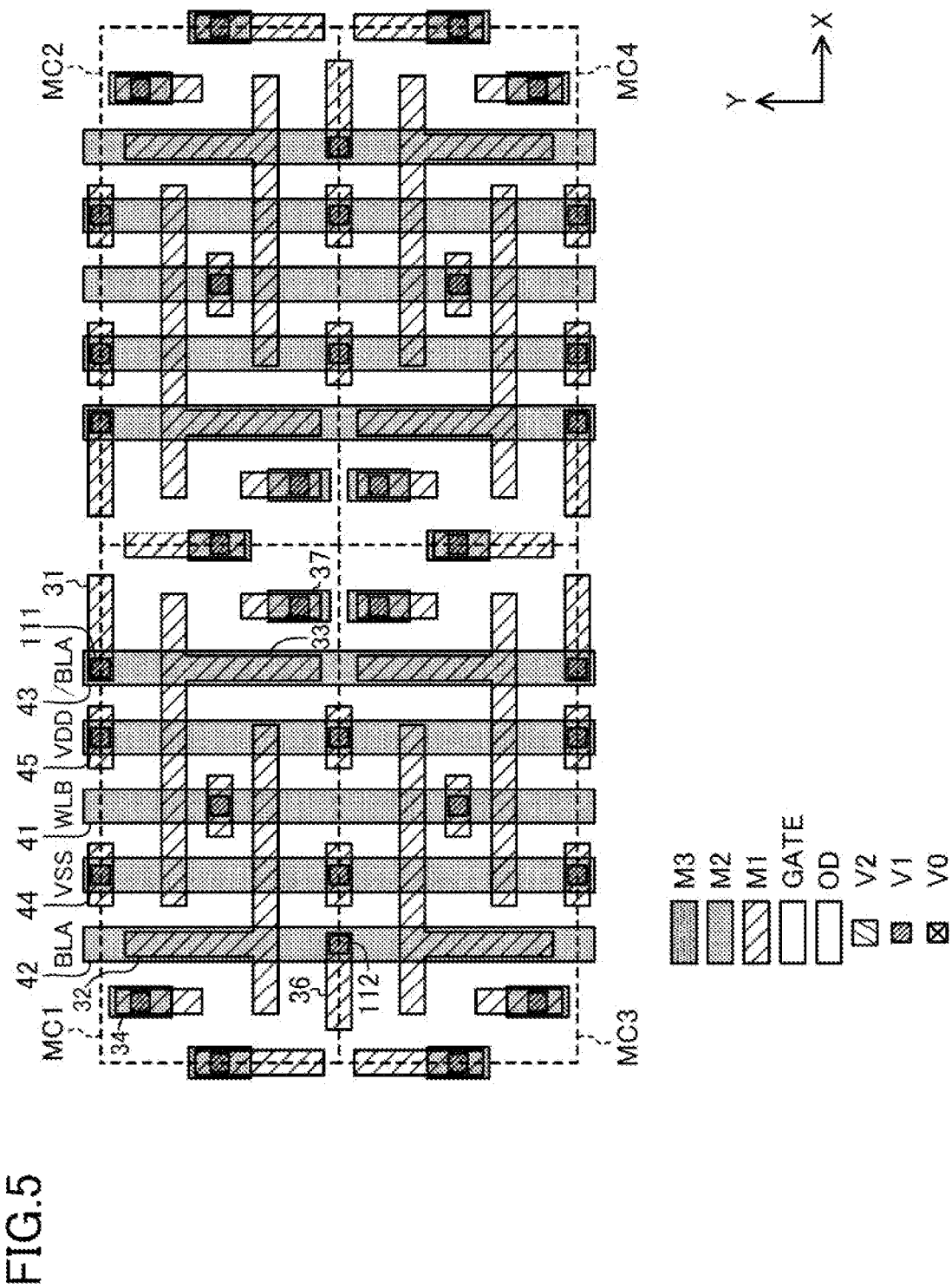
FIG. 5 is a layer-by-layer plan view showing the layout structure of FIG. 3.
Figure 6:
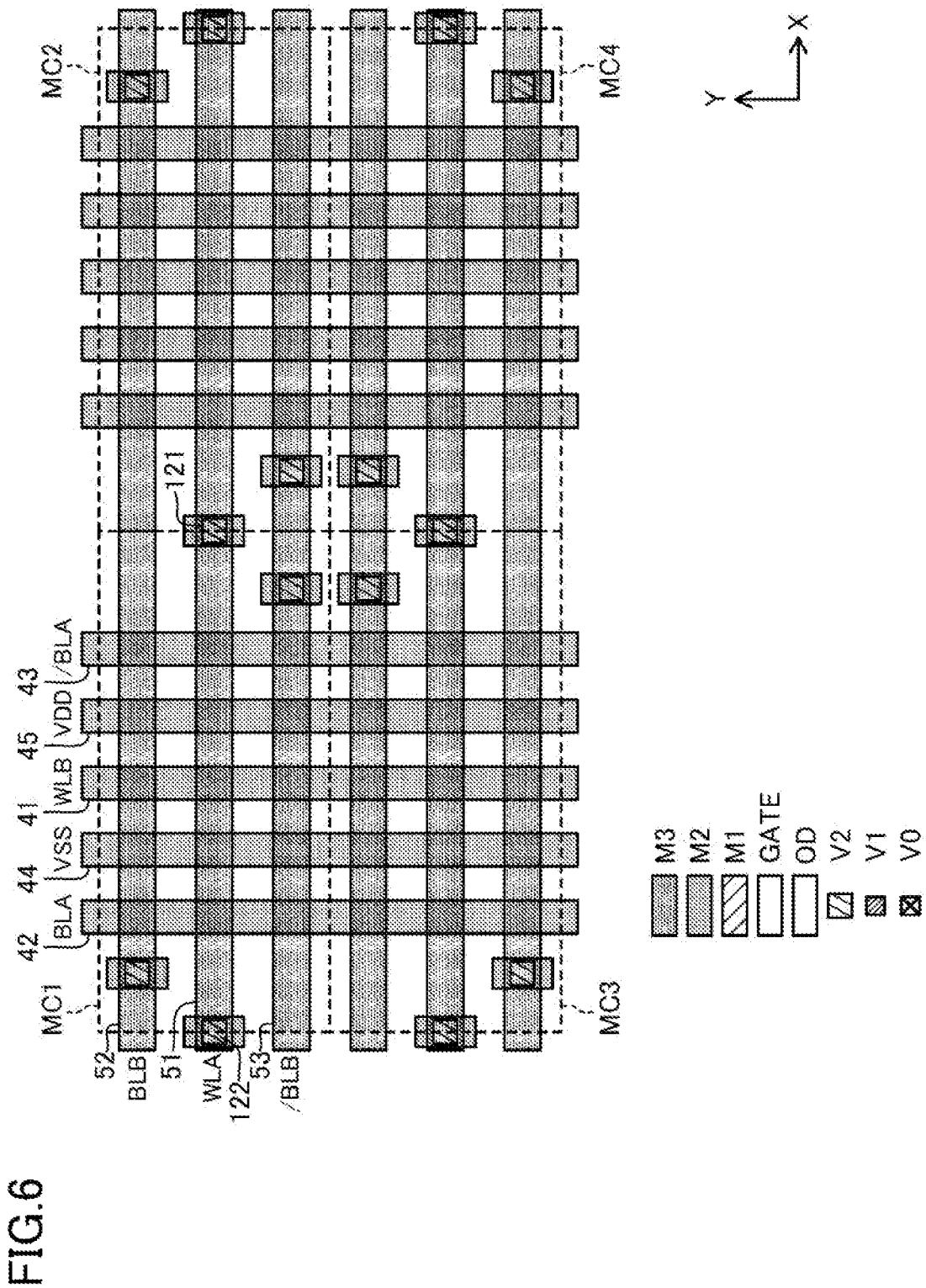
FIG. 6 is a layer-by-layer plan view showing the layout structure of FIG. 3.

FIG. 3 is a plan view showing an example of the layout structure of the memory cells 2 according to this embodiment. FIGS. 4 to 6 are plan views showing the layout structure of FIG. 3 layer by layer, where FIG. 4 shows layers from a diffusion layer to gate interconnects and a first metal wiring layer, FIG. 5 shows the first metal wiring layer and a second metal wiring layer, and FIG. 6 shows the second metal wiring layer and a third metal wiring layer. Note that, in the plan views such as FIG. 3, the horizontal direction is referred to as the X direction (corresponding to the first direction) and the vertical direction is referred to as the Y direction (corresponding to the second direction). Note also that OD refers to the diffusion layer, M1, M2, and M3 respectively refer to the first, second, and third metal wiring layers, V0 refers to vias formed between the first wiring layer and gates and between the first wiring layer and the diffusion layer, V1 refers to vias formed between the first and second wiring layers, and V2 refers to vias formed between the second and third wiring layers.

In FIG. 3 and the subsequent figures, 2×2 memory cells MC1, MC2, MC3, and MC4 are placed. The ranges of the memory cells MC1, MC2, MC3, and MC4 are shown by the broken lines. The memory cell MC2 has a layout structure inverted from the memory cell MC1 in the X direction, the memory cell MC3 has a layout structure inverted from the memory cell MC1 in the Y direction, and the memory cell MC4 has a layout structure inverted from the memory cell MC1 in the X and Y directions. In the actual semiconductor memory device, the memory cell array 1 has a number of memory cells 2.

Taking the memory cell MC1 as an example, the layout structure of the memory cell will be described. In this embodiment, it is assumed that transistors constituting the memory cell are planar MOS transistors.

A first word line (WLA) 51 and a second main bit line (BLB) 52 and a second sub-bit line (/BLB) 53 constituting the second bit line pair are formed to extend in the X direction in the third metal wiring layer. The arrangement is in the order of the second main bit line 52, the first word line 51, and the second sub-bit line 53 from the top of the figure.

A second word line (WLB) 41 and a first main bit line (BLA) 42 and a first sub-bit line (BLA) 43 constituting the first bit line pair are formed to extend in the Y direction in the second metal wiring layer. The arrangement is in the order of the first main bit line 42, the second word line 41, and the first sub-bit line 43 from the left of the figure. Also, a power supply line 44 for supply of VSS is formed to extend in the Y direction between the first main bit line 42 and the second word line 41. A power supply line 45 for supply of VDD is formed to extend in the Y direction between the second word line 41 and the first sub-bit line 43.

In the diffusion layer, n-type diffusion regions 11, 13, 14, and 15 and p-type diffusion regions 12 and 16 are formed. The diffusion regions 11 and 15 lie in line in the Y direction, and the diffusion regions 12 and 16 lie in line in the Y direction. The diffusion regions 14, 15, and 16 extend up to the region of the memory cell MC3 adjacent to the memory cell MC1 in the Y direction.

Gate interconnects 21, 22, 23, 24, and 25 are formed to extend in the X direction. The gate interconnects 21 and 22 lie in line in the X direction, and the gate interconnects 24 and 25 lie in line in the X direction. That is, the gate interconnects 21 to 25 are arranged in three rows in the Y direction. The gate interconnect 22 extends up to the region of the memory cell MC2 adjacent to the memory cell MC1 in the X direction.

The transistor TN1 is constituted by the diffusion region 11 and the gate interconnect 21. The transistor TP1 is constituted by the diffusion region 12 and the gate interconnect 21. The transistor TN4 is constituted by the diffusion region 13 and the gate interconnect 22. The transistors TN1, TP1, and TN4 lie in line in the X direction.

The transistor TN5 is constituted by the diffusion region 14 and the gate interconnect 23. The transistor TN6 is constituted by the diffusion region 13 and the gate interconnect 23. The transistors TN5 and TN6 lie in line in the X direction.

The transistor TN3 is constituted by the diffusion region 14 and the gate interconnect 24. The transistor TN2 is constituted by the diffusion region 15 and the gate interconnect 25. The transistor TP2 is constituted by the diffusion region 16 and the gate interconnect 25. The transistors TN3, TN2, and TP3 lie in line in the X direction.

In the first metal wiring layer, M1 interconnects 31, 32, 33, 34, 35, 36, 37, and 38 are formed. The gate interconnect 21 is connected with a portion of the diffusion region 14 located between the gate interconnects 23 and 24, a portion of the diffusion region 15 located above the gate interconnect 25 as viewed in the figure, and a portion of the diffusion region 16 located above the gate interconnect 25 as viewed in the figure, through the M1 interconnect 32 and vias. The gate interconnect 25 is connected with a portion of the diffusion region 11 located below the gate interconnect 21 as viewed in the figure, a portion of the diffusion region 12 located below the gate interconnect 21 as viewed in the figure, and a portion of the diffusion region 13 located between the gate interconnects 22 and 23, through the M1 interconnect 33 and vias.

A portion of the diffusion region 11 located above the gate interconnect 21 as viewed in the figure is connected with the power supply line 44 for supply of VSS through an M1 interconnect and vias. A portion of the diffusion region 12 located above the gate interconnect 21 as viewed in the figure is connected with the power supply line 45 for supply of VDD through an M1 interconnect and vias. A portion of the diffusion region 15 located below the gate interconnect 25 as viewed in the figure is connected with the power supply line 44 for supply of VSS through an M1 interconnect and vias. A portion of the diffusion region 16 located below the gate interconnect 25 as viewed in the figure is connected with the power supply line 45 for supply of VDD through an M1 interconnect and vias.

A portion of the diffusion region 13 located above the gate interconnect 22 as viewed in the figure is connected with the first sub-bit line 43 through the M1 interconnect 31 and a via 111. A portion of the diffusion region 13 located below the gate interconnect 23 as viewed in the figure is connected with the second sub-bit line 53 through the M1 interconnect 37, an M2 interconnect, and vias.

A portion of the diffusion region 14 located above the gate interconnect 23 as viewed in the figure is connected with the second main bit line 52 through the M1 interconnect 34, an M2 interconnect, and vias. A portion of the diffusion region 14 located below the gate interconnect 24 as viewed in the figure is connected with the first main bit line 42 through the M1 interconnect 36 and a via 112.

The gate interconnect 22 is connected with the first word line 51 through the M1 interconnect 38, an M2 interconnect, and a via 121. The gate interconnect 24 is connected with the first word line 51 through the M1 interconnect 35, an M2 interconnect, and a via 122. The gate interconnect 23 is connected with the second word line 41 through an M1 interconnect and vias.

The layout structure according to this embodiment has the following features.

In each memory cell, the gate interconnects extending in the X direction are arranged in three rows in the Y direction. With this arrangement, the size of the memory cell in the Y direction can be sufficiently secured for the first word line and the second bit line pair extending in the X direction. For example, in the memory cell MC1, the gate interconnects 21 and 22 are placed in the first row, the gate interconnect 23 in the second row, and the gate interconnects 24 and 25 in the third row in this order from the top of the figure. Accordingly, the size of the memory cell MC1 in the Y direction is sufficiently secured for the first word line and the second bit line pair extending in the X direction. In the memory cell MC1, the gate interconnects 21 and 22 in the first row form the gates of the transistors TN1 and TP1 constituting the first inverter INV1 and the gate of the transistor TN4. The gate interconnect 23 in the second row forms the gates of the transistors TN5 and TN6. The gate interconnects 24 and 25 in the third row form the gate of the transistor TN3 and the gates of the transistors TN2 and TP2 constituting the second inverter INV2.

Each memory cell is connected with the first word line extending in the X direction through vias formed at both ends of the memory cell in the X direction. With this connection, two memory cells adjacent in the X direction are connectable with the first word line through a common contact, whereby the area of the memory cell array 1 can be reduced. For example, the memory cell MC1 is connected with the first word line 51 through the vias 121 and 122 formed at both ends in the X direction. With this connection, the memory cells MC1 and MC2, for example, are connected with the first word line 51 through the common contact 121.

Also, each memory cell is connected with the first main bit line and the first sub-bit line extending in the Y direction through vias formed at the ends of the memory cell in the Y direction. With this connection, two memory cells adjacent in the Y direction are connectable with the first main bit line or the first sub-bit line through a common via, whereby the area of the memory cell array 1 can be reduced. For example, the memory cell MC1 is connected with the first main bit line 42 through the via 112 formed at the lower end in the Y direction as viewed in the figure, and connected with the first sub-bit line 43 through the via 111 formed at the upper end in the Y direction as viewed in the figure. With this connection, the memory cells MC1 and MC3, for example, are connected with the first main bit line 42 through the common contact 112.

The transistor TN4 is located on the right side with respect to the transistors TN1 and TP1 constituting the inverter INV1 in the X direction, and the transistor TN3 is located on the left side with respect to the transistors TN2 and TP2 constituting the inverter INV2 in the X direction, as viewed in the figure. In this way, by placing the transistors TN3 and TN4 point-symmetrically with respect to the center of the memory cell MC1, the area of the memory cell MC1 can be made smaller.

In the second metal wiring layer, by placing the power supply line 44 for supply of VSS between the second word line 41 and the first main bit line 42, crosstalk between the second word line 41 and the first main bit line 42 can be prevented or reduced. Also, by placing the power supply line 45 for supply of VDD between the second word line 41 and the first sub-bit line 43, crosstalk between the second word line 41 and the first sub-bit line 43 can be prevented or reduced.

(Alteration 1)

Figure 7:
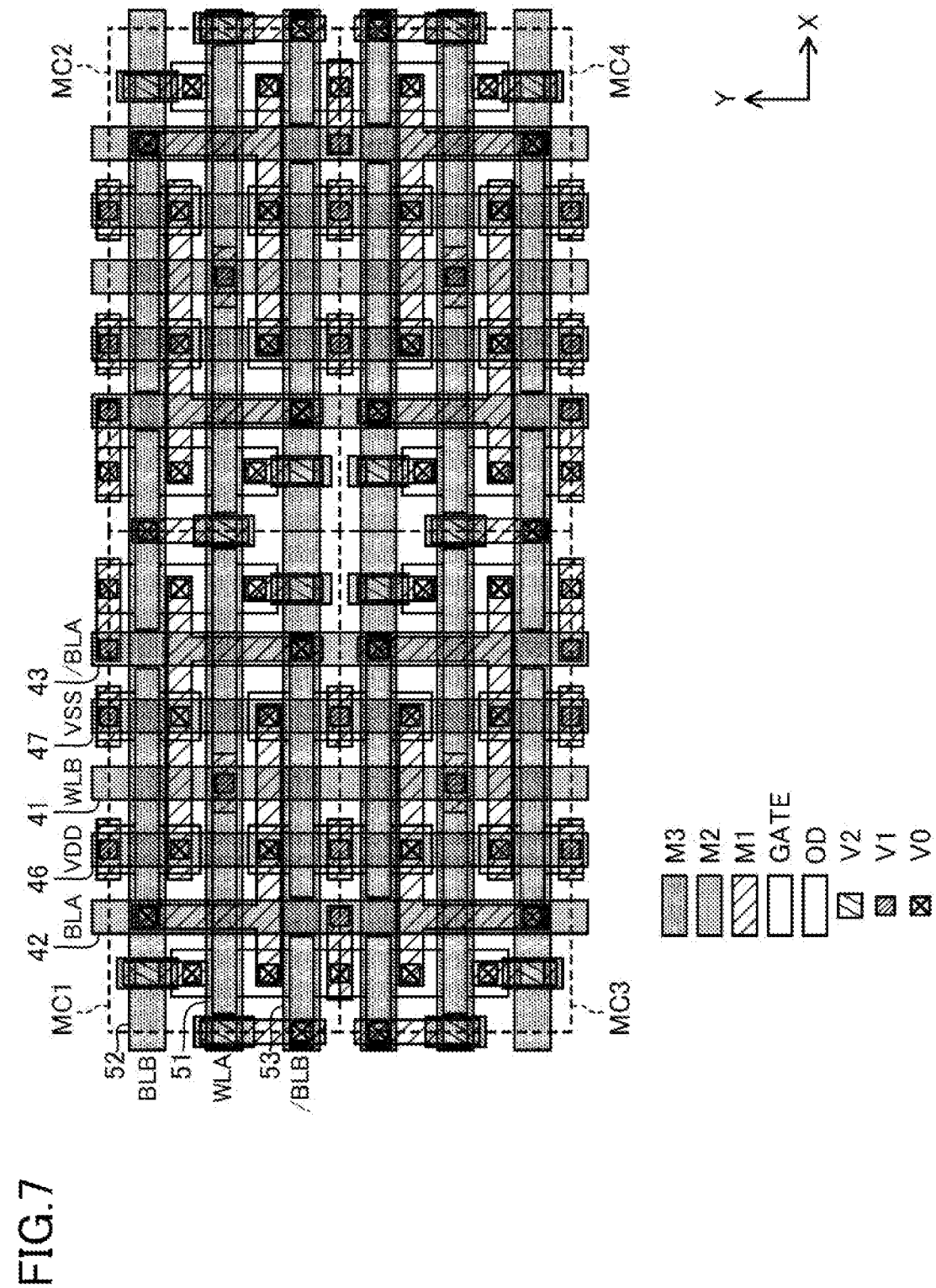
FIG. 7 is a plan view showing an example of the layout structure of SRAM cells according to Alteration 1.
Figure 8:
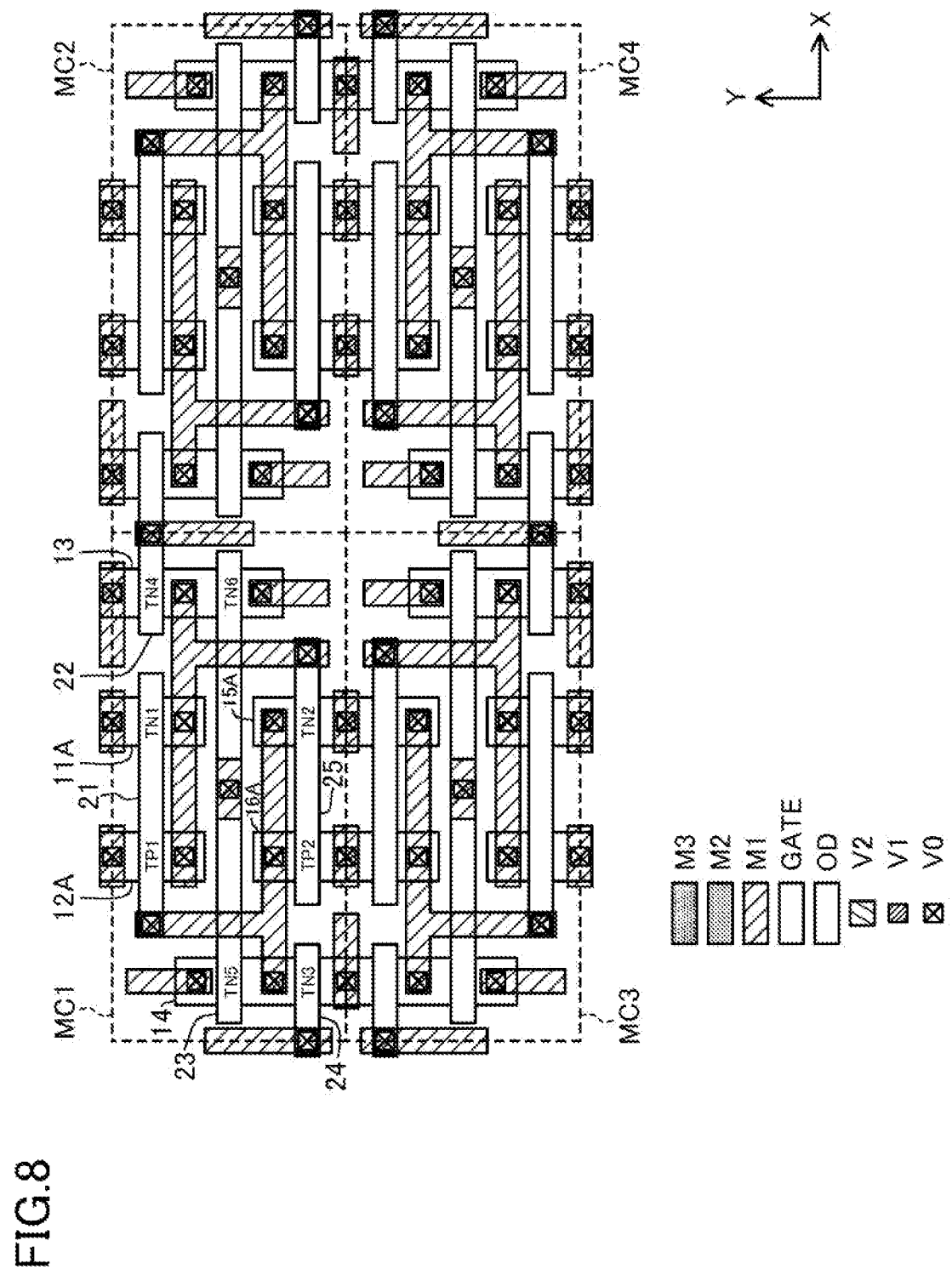
FIG. 8 is a layer-by-layer plan view showing the layout structure of FIG. 7.

FIG. 7 is a plan view showing an example of the layout structure of memory cells 2 according to Alteration 1. FIG. 8 shows layers from the diffusion layer to the gate interconnects and the first metal wiring layer in the layout structure of FIG. 7.

In this alteration, in comparison with the layout structure according to the above embodiment, the positions are changed between the power supply line for supply of VSS and the power supply line for supply of VDD in the second metal wiring layer. With this change, the positions of the transistors TN1 and TP1 constituting the first inverter INV1 are changed with each other, and the positions of the transistors TN2 and TP2 constituting the second inverter INV2 are changed with each other. The other configuration is similar to the layout structure according to the above embodiment.

Taking the memory cell MC1 as an example, p-type diffusion regions 12A and 16A are formed in place of the n-type diffusion regions 11 and 15 in the above embodiment. Also, n-type diffusion regions 11A and 15A are formed in place of the p-type diffusion regions 12 and 16 in the above embodiment. The transistor TP1 is constituted by the diffusion region 12A and the gate interconnect 21. The transistor TN1 is constituted by the diffusion region 11A and the gate interconnect 21. The transistor TP2 is constituted by the diffusion region 16A and the gate interconnect 25. The transistor TN2 is constituted by the diffusion region 15A and the gate interconnect 25.

A power supply line 46 for supply of VDD is formed to extend in the Y direction between the first main bit line 42 and the second word line 41. Also, a power supply line 47 for supply of VSS is formed to extend in the Y direction between the second word line 41 and the first sub-bit line 43.

A portion of the diffusion region 12A located above the gate interconnect 21 as viewed in the figure is connected with the power supply line 46 for supply of VDD through an M1 interconnect and vias. A portion of the diffusion region 11A located above the gate interconnect 21 as viewed in the figure is connected with the power supply line 47 for supply of VSS through an M1 interconnect and vias. A portion of the diffusion region 16A located below the gate interconnect 25 as viewed in the figure is connected with the power supply line 46 for supply of VDD through an M1 interconnect and vias. A portion of the diffusion region 15A located below the gate interconnect 25 as viewed in the figure is connected with the power supply line 47 for supply of VSS through an M1 interconnect and vias.

The layout structure according to this alteration has features similar to those of the layout structure according to the above embodiment and obtains similar effects.

That is, in each memory cell, the gate interconnects extending in the X direction are arranged in three rows in the Y direction. With this arrangement, the size of the memory cell in the Y direction can be sufficiently secured for the first word line and the second bit line pair extending in the X direction.

Each memory cell is connected with the first word line extending in the X direction through vias formed at both ends of the memory cell in the X direction. With this connection, two memory cells adjacent in the X direction are connectable with the first word line through a common via, whereby the area of the memory cell array 1 can be reduced.

Also, each memory cell is connected with the first main bit line and the first sub-bit line extending in the Y direction through vias formed at the ends of the memory cell in the Y direction. With this connection, two memory cells adjacent in the Y direction are connectable with the first main bit line or the first sub-bit line through a common via, whereby the area of the memory cell array 1 can be reduced.

The transistor TN4 is located on the right side with respect to the transistors TP1 and TN1 constituting the inverter INV1 in the X direction as viewed in the figure, and the transistor TN3 is located on the left side with respect to the transistors TP2 and TN2 constituting the inverter INV2 in the X direction as viewed in the figure. In this way, by placing the transistors TN3 and TN4 point-symmetrically with respect to the center of the memory cell MC1, the area of the memory cell MC1 can be made smaller.

In the second metal wiring layer, by placing the power supply line 47 for supply of VSS between the second word line 41 and the first sub-bit line 43, crosstalk between the second word line 41 and the first sub-bit line 43 can be prevented or reduced. Also, by placing the power supply line 46 for supply of VDD between the second word line 41 and the first main bit line 42, crosstalk between the second word line 41 and the first main bit line 42 can be prevented or reduced.

(Alteration 2)

Figure 9:
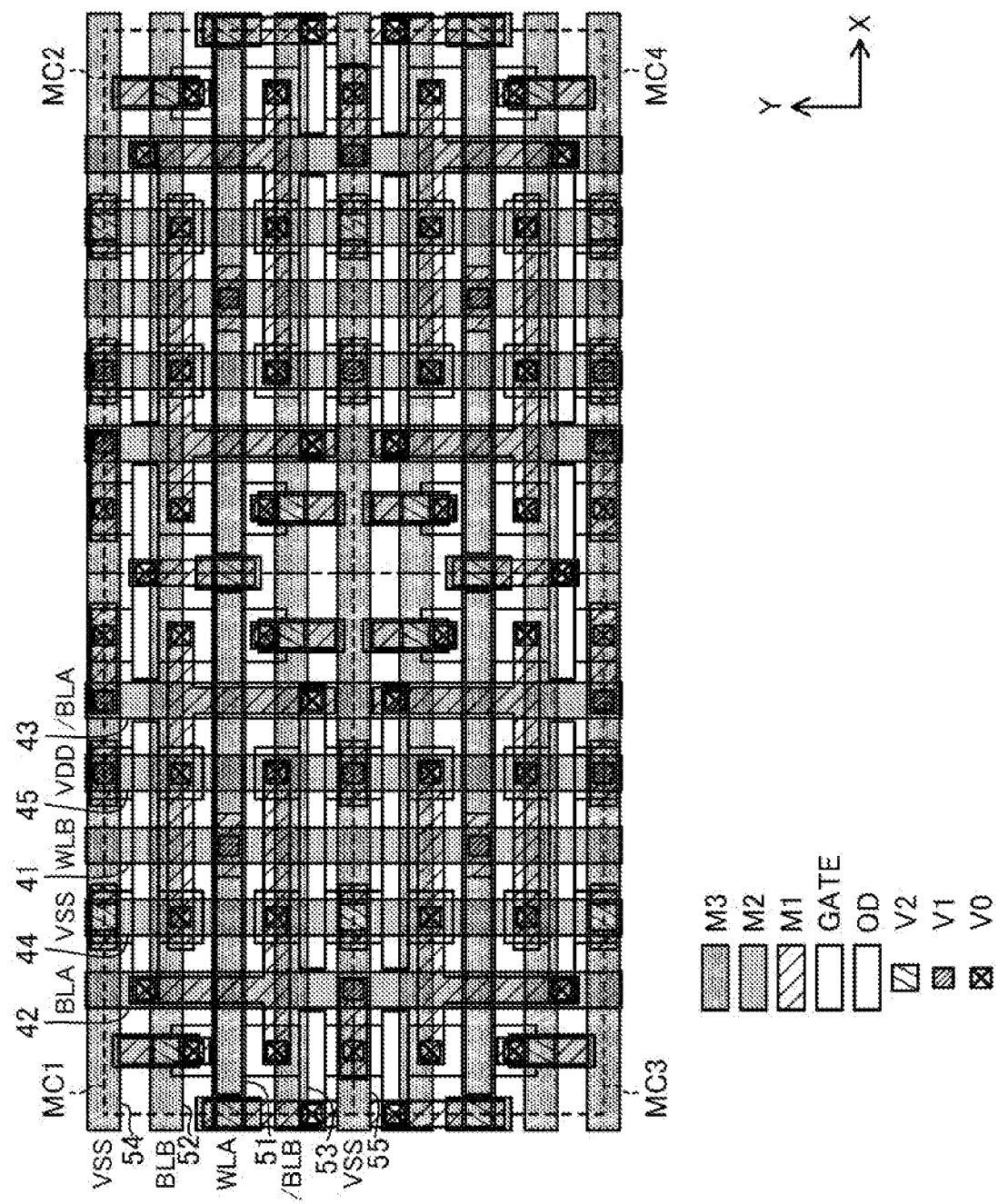
FIG. 9 is a plan view showing an example of the layout structure of SRAM cells according to Alteration 2.
Figure 10:
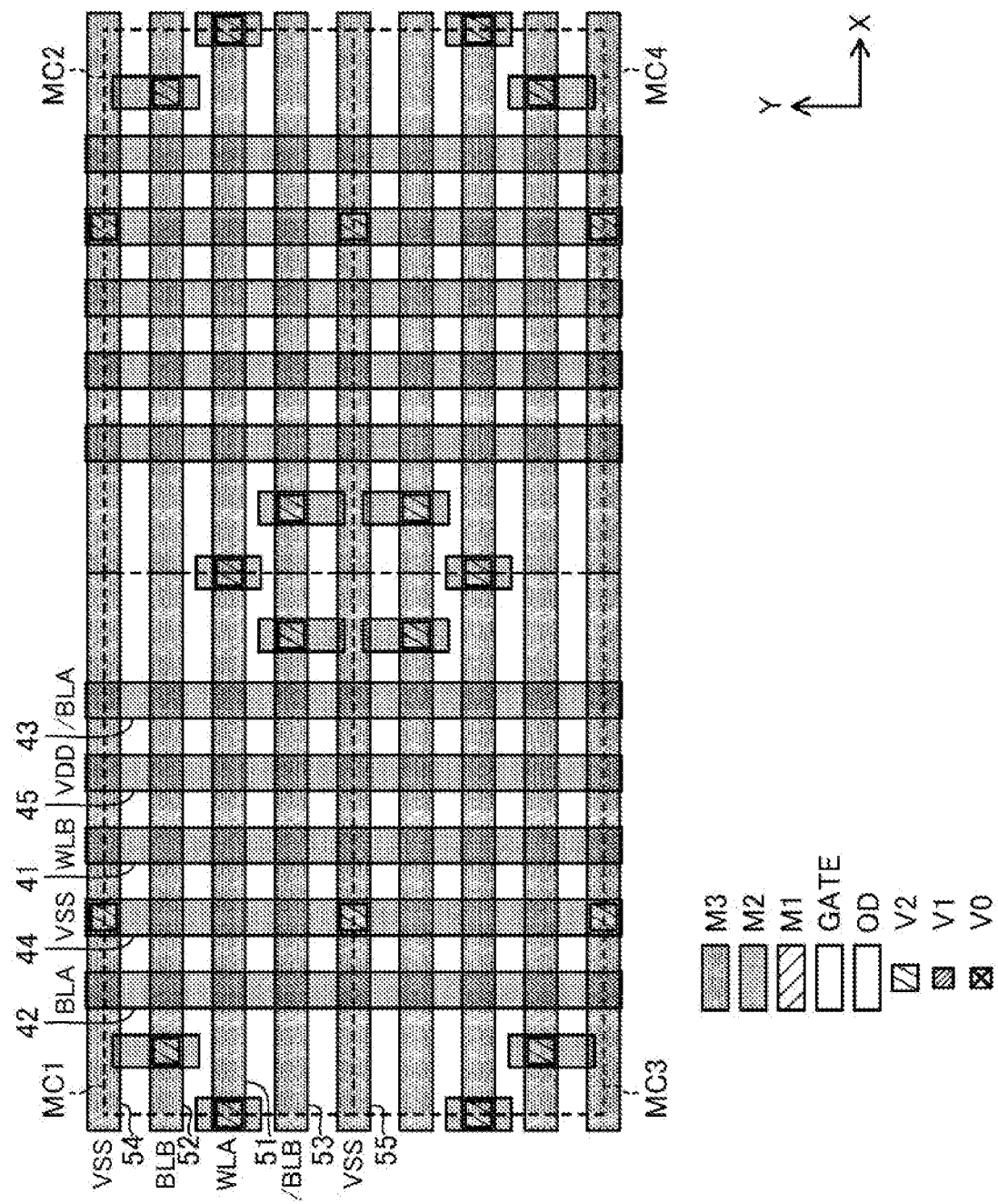
FIG. 10 is a layer-by-layer plan view showing the layout structure of FIG. 9.

FIG. 9 is a plan view showing an example of the layout structure of memory cells 2 according to Alteration 2. FIG. 10 shows the second and third metal wiring layers in the layout structure of FIG. 9.

In this alteration, in comparison with the layout structure according to the above embodiment, power supply lines are provided in the third metal wiring layer. Specifically, power supply lines for supply of VSS extending in the X direction are placed on the boundaries between memory cells adjacent in the Y direction. The other configuration is similar to the layout structure according to the above embodiment.

Taking the memory cell MC1 as an example, a power supply line 54 for supply of VSS is placed above the second main bit line 52 as viewed in the figure, and a power supply line 55 for supply of VSS is placed below the second sub-bit line 53 as viewed in the figure.

The layout structure according to this alteration has also features similar to those of the layout structure according to the above embodiment. In addition, in this alteration, power supply can be strengthened by placing power supply lines in the third metal wiring layer. Also, by the placement of power supply lines for supply of VSS, crosstalk between the second main bit line and the second sub-bit line can be prevented or reduced.

In this alteration, it is acceptable to place power supply lines for supply of VDD in the third metal wiring layer, or place both power supply lines for supply of VSS and power supply lines for supply of VDD in the third metal wiring layer. For example, in the memory cell MC1, a power supply line for supply of VDD may be placed above the second main bit line 52 as viewed in the figure and a power supply line for supply of VSS may be placed below the second sub-bit line 53 as viewed in the figure.

Also, as in Alteration 1, the positions may be changed between the power supply line for supply of VSS and the power supply line for supply of VDD in the second metal wiring layer, the positions of the transistors TN1 and TP1 constituting the first inverter INV1 may be changed with each other, and the positions of the transistors TN2 and TP2 constituting the second inverter INV2 may be changed with each other.

In the above embodiment and alterations, description has been made assuming that the transistors constituting each memory cell are planar MOS transistors. The transistors constituting the memory cell are not limited to this type, but fin transistors and nanowire transistors, for example, may be used.

According to the present disclosure, a layout structure suitable for memory cells of a 2-port SRAM can be presented. The present disclosure is therefore useful for improvement of the performance of a semiconductor memory device, for example.

What is claimed is:

1. A semiconductor memory device, comprising:
   a memory cell;
   a first word line extending in a first direction;
   a first bit line pair constituted by a first main bit line and a first sub-bit line extending in a second direction perpendicular to the first direction;
   a second word line extending in the second direction; and
   a second bit line pair constituted by a second main bit line and a second sub-bit line extending in the first direction,
   wherein the memory cell includes:
   a first inverter including a first p-type transistor and a first n-type transistor connected in series, an input of the first inverter being connected with a first node and an output connected with a second node,
   a second inverter including a second p-type transistor and a second n-type transistor connected in series, an input of the second inverter being connected with the second node and an output connected with the first node,
   a third n-type transistor connected between the first main bit line and the first node, having a gate connected with the first word line, a fourth n-type transistor connected between the first sub-bit line and the second node, having a gate connected with the first word line,
a fifth n-type transistor connected between the second main bit line and the first node, having a gate connected with the second word line, and
a sixth n-type transistor connected between the second sub-bit line and the second node, having a gate connected with the second word line,
gate interconnects that are to be gates of the first and second p-type transistors and the first to sixth n-type transistors extend in the first direction and are arranged in three rows in the second direction,
the gate interconnects in the first row form the gates of the first n-type transistor, the first p-type transistor, and the fourth n-type transistor,
the gate interconnect in the second row forms the gates of the fifth and sixth n-type transistors, and
the gate interconnects in the third row form the gates of the third n-type transistor, the second n-type transistor, and the second p-type transistor.

2. A semiconductor memory device, comprising:
a memory cell;
a first word line extending in a first direction;
a first bit line pair constituted by a first main bit line and a first sub-bit line extending in a second direction perpendicular to the first direction;
a second word line; and
a second bit line pair constituted by a second main bit line and a second sub-bit line,
wherein the memory cell includes:
  a first inverter including a first p-type transistor and a first n-type transistor connected in series, an input of the first inverter being connected with a first node and an output connected with a second node,
  a second inverter including a second p-type transistor and a second n-type transistor connected in series, an input of the second inverter being connected with the second node and an output connected with the first node,
  a third n-type transistor connected between the first main bit line and the first node, having a gate connected with the first word line,
  a fourth n-type transistor connected between the first sub-bit line and the second node, having a gate connected with the first word line,
  a fifth n-type transistor connected between the second main bit line and the first node, having a gate connected with the second word line, and
  a sixth n-type transistor connected between the second sub-bit line and the second node, having a gate connected with the second word line,
gate interconnects that are to be gates of the first and second p-type transistors and the first to sixth n-type transistors extend in the first direction and are arranged in three rows in the second direction,
the gate interconnects in the first row form the gates of the first n-type transistor, the first p-type transistor, and the fourth n-type transistor,
the gate interconnect in the second row forms the gates of the fifth and sixth n-type transistors,
the gate interconnects in the third row form the gates of the third n-type transistor, the second n-type transistor, and the second p-type transistor, and
the memory cell is connected with the first word line through a via formed at an end of the memory cell in the first direction, and is connected with the first main bit line and the first sub-bit line through vias formed at ends of the memory cell in the second direction.

3. A semiconductor memory device, comprising:
a memory cell;
a first word line;
a first bit line pair constituted by a first main bit line and a first sub-bit line;
a second word line; and
a second bit line pair constituted by a second main bit line and a second sub-bit line,
wherein the memory cell includes:
  a first inverter including a first p-type transistor and a first n-type transistor connected in series, an input of the first inverter being connected with a first node and an output connected with a second node,
  a second inverter including a second p-type transistor and a second n-type transistor connected in series, an input of the second inverter being connected with the second node and an output connected with the first node,
  a third n-type transistor connected between the first main bit line and the first node, having a gate connected with the first word line,
  a fourth n-type transistor connected between the first sub-bit line and the second node, having a gate connected with the first word line,
  a fifth n-type transistor connected between the second main bit line and the first node, having a gate connected with the second word line, and
  a sixth n-type transistor connected between the second sub-bit line and the second node, having a gate connected with the second word line,
gate interconnects that are to be gates of the first and second p-type transistors and the first to sixth n-type transistors extend in a first direction and are arranged in three rows in a second direction perpendicular to the first direction,
the gate interconnects in the first row form the gates of the first n-type transistor, the first p-type transistor, and the fourth n-type transistor,
the gate interconnect in the second row forms the gates of the fifth and sixth n-type transistors,
the gate interconnects in the third row form the gates of the third n-type transistor, the second n-type transistor, and the second p-type transistor,
the fourth n-type transistor is located on a first-hand side in the first direction with respect to the first n-type transistor and the first p-type transistor, and
the third n-type transistor is located on a second-hand side in the first direction with respect to the second n-type transistor and the second p-type transistor, the second-hand side being the side opposite to the first-hand side.

* * * * *